United States Patent
Shi et al.

(10) Patent No.: US 8,472,556 B2
(45) Date of Patent: Jun. 25, 2013

(54) AMPLIFIER DEVICE AND PREDISTORTION CONTROL METHOD

(75) Inventors: Zhan Shi, Beijing (CN); Hui Li, Beijing (CN); Jian Min Zhou, Beijing (CN); Gang Sun, Beijing (CN); Zhiqi Wang, Beijing (CN)

(73) Assignee: Fujitsu Limited, Kawasaki (JP)

( * ) Notice: Subject to any disclaimer, the term of this patent is extended or adjusted under 35 U.S.C. 154(b) by 436 days.

(21) Appl. No.: 12/878,176

(22) Filed: Sep. 9, 2010

(65) Prior Publication Data

US 2011/0068868 A1 Mar. 24, 2011

(30) Foreign Application Priority Data

Sep. 18, 2009 (CN) .......................... 2009 1 0171901

(51) Int. Cl.
*H04L 25/03* (2006.01)
*H04L 25/49* (2006.01)

(52) U.S. Cl.
USPC ........ 375/297; 375/295; 330/149; 455/114.3; 455/522

(58) Field of Classification Search
USPC ......... 375/295, 297; 455/114.3, 522; 330/149
See application file for complete search history.

(56) References Cited

U.S. PATENT DOCUMENTS

| 5,930,301 | A | 7/1999 | Chester et al. |
| 7,414,470 | B2 | 8/2008 | Okazaki |
| 2003/0184374 | A1* | 10/2003 | Huang et al. ................. 330/149 |
| 2007/0008033 | A1 | 1/2007 | Okazaki |
| 2007/0096811 | A1 | 5/2007 | Kokkeler |
| 2010/0001795 | A1* | 1/2010 | Shi et al. ....................... 330/149 |

FOREIGN PATENT DOCUMENTS

| CN | 1174450 | 2/1998 |
| CN | 1897457 | 1/2007 |

OTHER PUBLICATIONS

Chinese First Office Action dated Sep. 5, 2012, from corresponding Chinese Application No. 200910171901.6.

* cited by examiner

*Primary Examiner* — Ted Wang
(74) *Attorney, Agent, or Firm* — Katten Muchin Rosenman LLP

(57) ABSTRACT

This invention relates to an amplifier device and a predistortion control method. The amplifier device comprises a predistortion unit, a predistortion control unit, and an amplifier unit, of which the predistortion control unit controls the predistortion unit in accordance with a signal fed back from the amplifier unit. The predistortion control method comprises determining power of a left side lobe of two side lobes of a frequency spectrum of the signal fed back from the amplifier unit; determining power of a right side lobe of two side lobes of a frequency spectrum of the signal fed back from the amplifier unit; determining a cost function in accordance with the power of the first and right side lobes, and controlling the predistortion unit in accordance with the cost function.

10 Claims, 7 Drawing Sheets

AMPLIFIER DEVICE AND PREDISTORTION CONTROL METHOD

FIELD OF THE INVENTION

The present invention relates to digital predistortion linearization of nonlinear devices, and more particularly to linearization of a power amplifier with memory effect.

BACKGROUND OF THE INVENTION

The power amplifier (PA) is an important component part in an electronic device, as it can amplify the power of a weak electric signal to satisfy the need of transmission and emission. The energy for amplification comes from a DC power source, i.e. the PA converts DC energy into an AC signal to enable the power intensity of the AC signal to satisfy the demand. The capacity for the PA to convert the DC energy into AC energy is referred to as efficiency of the PA. The input/output signal power relation of the PA can be divided into a linear region, a nonlinear region and a saturated region.

When the envelope of an input signal fluctuates only in the linear region, the input signal is ideally amplified. But when the envelope of the input signal fluctuates to the nonlinear region, the output signal will be distorted. Such distortion manifests itself in the time domain as that the output signal is not an ideal amplification of the input signal, while manifests itself in the frequency domain as that the side lobe of the spectrum of the output signal is raised, and the main lobe is distorted.

Due to physical causes, when the envelope of the input signal fluctuates deep into the nonlinear region, efficiency of the PA is by far greater than the circumstance in which the envelope of the input signal fluctuates only in the linear region. With the advent of new modulation schemes, dynamic range of the signal envelope becomes larger and larger, so that the occurrence of nonlinear distortion is inevitable.

Baseband digital predistortion technique is an effective means in overcoming PA nonlinearity. By simulating inverse characteristics of the PA, the technique predistorts the baseband digital signal, so as to obtain an ideally amplified signal at the output terminal of the PA.

To simulate inverse characteristics of the PA in real-time, the traditional method needs to compare the input signal with the output feedback signal of the PA one sample point by one sample point, and this is referred to as vector method. The vector method is relatively high in cost because it demands precise feedback signal and demands precise synchronization of the input signal with the feedback signal. The scalar method as recently coming in vogue investigates and compares statistical characteristics of the feedback signal, so that the above problems are avoided.

FIG. 1 schematically illustrates the structure of a scalar method based baseband digital predistortion device. As shown in FIG. 1, the original signal $x(n)$ first enters the predistorter 100 to be formed of a predistorted signal $z(n)$, which is thereafter sent into power amplification 103 after passing through A/D converter 108 and up converter 109. The power amplified output signal $y(n)$ is fed back from a coupler 104, is attenuated via an attenuator 105, and then enters a cost function generator 106. The cost function generated thereby is sent into a control update unit 107 that controls the operation of the predistorter 100. The cost function generator 106 and the control update unit 107 make up of a predistortion controller 110. The predistorter 100 mainly includes a predistortion data generation unit 101 and a multiplier 102. The predistortion data generation unit 101 generates predistortion data in accordance with the original input signal $x(n)$ and a parameter provided by the control update unit 107, and the predistortion data is multiplied with the original signal by the multiplier 102 to obtain the predistorted signal $z(n)$.

In the conventional predistorter, the cost function generator 106 calculates out-band power, and the control update unit 107 updates the predistortion parameter in accordance with the out-band power.

FIG. 2 is a view schematically illustrating a traditional predistorter 200. As shown in FIG. 2, the original signal $x(n)$ is divided into three branches, one branch enters an amplitude predistortion data generation unit 201, and another branch enters a phase predistortion data generation unit 202 to obtain amplitude predistortion data and phase predistortion data respectively, while the remaining branch is multiplied with the amplitude predistortion data and the phase predistortion data respectively at multipliers 203 and 204 to obtain the predistorted signal $z(n)$.

As the inventors of the present invention found during the development of the present invention, with the gradual increase in bandwidth of the communication system, frequency selectivity (memory effect) of the PA becomes gradually apparent. However, the traditional scalar method does not take memory effect into consideration. As a result, the performance of predistorter employing the conventional predistortion technique is far from being ideal.

SUMMARY OF THE INVENTION

Embodiments of the present invention are proposed in view of the aforementioned problems in the conventional technology, to eliminate or alleviate one or more problems of the conventional technology, and to provide at least one advantageous choice.

To achieve the objectives of the present invention, the present invention provides the following aspects.

Aspect 1: An amplifier device, comprising a predistorter, a predistortion controller, a digital to analog (D/A) converter and an amplifier unit, the predistorter predistorts a digital signal to be amplified, the D/A converter converts the predistorted digital signal to an analog signal, the amplifier unit amplifies the analog signal, and the predistortion controller controls the predistorter in accordance with a signal fed back from the amplifier unit, wherein, the predistortion controller determines power of a left side lobe and a right side lobe of two side lobes of a frequency spectrum of the signal fed back from the amplifier unit, determines a cost function in accordance with the power of the two side lobes, and controls the predistorter in accordance with the cost function; the predistorter is one of the following two types of structures: structure 1: the predistorter comprises a filter unit and a phase amplitude predistortion data generation unit, the phase amplitude predistortion data generation unit generates data after an amplitude predistortion and a phase predistortion, the filter unit filters at least one of data inputted to and outputted from the phase amplitude predistortion data generation unit; structure 2: the predistorter comprises n phase amplitude predistortion data generation units, (n−1) delay units and an adder, the (n−1) delay units delay input data, respectively, to generate (n−1) delayed input data, the n phase amplitude predistortion data generation units predistort undelayed input data and the (n−1) delayed input data, respectively, to generate n data after an amplitude predistortion and a phase predistortion, the adder adds the data after the amplitude predistortion and the phase predistortion from the n phase amplitude predistortion data generation units, wherein n is an integer greater than or equal to 2.

Aspect 2: The amplifier device according to Aspect 1, wherein the predistortion controller comprises: a down frequency conversion unit for performing a down frequency conversion of the signal fed back from the amplifier unit; an analog to digital (A/D) converter for performing an A/D conversion of the data after the down frequency conversion; a left side lobe power determination unit for determining the power of the left side lobe of the two side lobes; a right side lobe power determination unit for determining the power of the right side lobe of the two side lobes; a cost function determination unit for taking the larger one of the power of the first side lobes and the power of the right side lobe as the cost function; and an update control unit for controlling the predistorter in accordance with the cost function.

Aspect 3: The amplifier device according to Aspect 2, wherein the left side lobe power determination unit or the right side lobe power determination unit performs a digital time domain filtering of the data after the AD conversion, or performs a FFT on the data after the AD conversion and then performs a frequency domain filtering, so as to obtain the power of the left side lobe or of the right side lobe.

Aspect 4: The amplifier device according to Aspect 1, wherein the predistortion controller comprises: a power divider for equally dividing the signal fed back from the amplifier unit into a first portion of signal and a second portion of signal having the equal power; a first band-pass filter for filtering the first portion of signal, so as to filter and obtain composition corresponding to the left side lobe of the two side lobes; a second band-pass filter for filtering the second portion of signal, so as to filter and obtain composition corresponding to the right side lobe of the two side lobes; a first power detector for detecting power of the composition of the left side lobe; a second power detector for detecting power of the composition of the right side lobe; a power comparator for comparing the power of the composition of the left side lobe with the power of the composition of the right side lobe, and taking the larger one as the cost function; and an update control unit for controlling the predistorter in accordance with the cost function.

Aspect 5: The amplifier device according to Aspect 1, wherein the predistortion controller comprises: a down frequency conversion unit for performing a down frequency conversion of the signal fed back from the amplifier unit; an analog to digital (A/D) converter for performing an A/D conversion of the data after the down frequency conversion; an amplitude characteristics cost function calculation unit for determining a cost function related to amplitude characteristics in accordance with the data after the AD conversion; a phase characteristics cost function calculation unit for determining a cost function related to phase characteristics in accordance with the data after the AD conversion; a memory effect cost function calculation unit for determining a cost function related to memory effect; and an update control unit for controlling the predistorter in accordance with the cost function related to amplitude characteristics, the cost function related to phase characteristics, and the cost function related to memory effect, respectively.

Aspect 6: The amplifier device according to Aspect 5, wherein the amplitude characteristics cost function calculation unit calculates a difference between amplitude distribution functions of the fed back signal and a signal source, or a difference between peak-to-average power ratios of the fed back signal and the signal source as the cost function related to amplitude characteristics.

Aspect 7: The amplifier device according to Aspect 5, wherein the memory effect cost function calculation unit calculates the power of the first and right side lobes of the two side lobes, and takes a difference between the power of the first and right side lobes as the cost function related to memory effect.

Aspect 8: The amplifier device according to Aspect 5, wherein the cost function related to amplitude characteristics is a cost function only related to amplitude characteristics, the cost function related to memory effect is a cost function only related to memory effect, while the cost function related to phase characteristics is a cost function related to all of the phase characteristics, memory effect and amplitude characteristics, the update control unit firstly controls the predistorter in accordance with the cost function related to amplitude characteristics and the cost function related to phase characteristics, respectively, and then controls the predistorter in accordance with the cost function related to memory effect.

Aspect 9: The amplifier device according to Aspect 1, wherein the phase amplitude predistortion data generation unit comprises: an address generator for acquiring an amplitude address and a phase address in accordance with a signal amplitude or phase inputted to the phase amplitude predistortion data generation unit; an initial value acquisition unit for determining an initial predistortion amplitude in accordance with the amplitude address, and acquiring an initial predistortion phase in accordance with the phase address; an amplitude predistortion unit for the amplitude address, and for determining data after the amplitude predistortion in accordance with an amplitude address range determined based on a key amplitude address; a phase predistortion unit for the phase address, and for determining data after the phase predistortion in accordance with a phase address range determined based on a key phase address; and a multiplication unit for multiplying the data after the amplitude predistortion with the data after the phase predistortion.

Aspect 10: The amplifier device according to Aspect 9, wherein the amplitude predistortion unit comprises: an amplitude predistortion first selecting unit, for selecting a reference predistortion amplitude in accordance with the amplitude address and an amplitude address range determined by a key amplitude address; a subtracter, for subtracting the reference predistortion amplitude selected by the amplitude predistortion first selecting unit from the initial predistortion amplitude; an amplitude predistortion second selecting unit, for selecting a predistortion amplitude coefficient in accordance with the amplitude address and an amplitude address range determined by the key amplitude address; a multiplier, for multiplying the output from the subtracter with the predistortion amplitude coefficient; an adder, for adding the output from the multiplier to the reference predistortion amplitude; and a feedback control unit, for updating the reference predistortion amplitude using the output from the adder when the amplitude address is identical with the address to which the reference predistortion amplitude corresponds.

Aspect 11: The amplifier device according to Aspect 9, wherein the phase predistortion unit comprises: a phase predistortion first selecting unit, for selecting a reference predistortion phase in accordance with the phase address and a phase address range determined by a key phase address; a subtracter, for subtracting the reference predistortion phase selected by the phase predistortion first selecting unit from the initial predistortion phase; a phase predistortion second selecting unit, for selecting a predistortion phase coefficient in accordance with the phase address and a phase address range determined by the key phase address; a multiplier, for multiplying the output from the subtracter with the predistortion phase coefficient; an adder, for adding the output from the multiplier to the reference predistortion phase; and a feedback control unit, for updating the reference predistortion phase using the output from the adder when the amplitude address is identical with the address to which the reference predistortion amplitude corresponds.

Aspect 12: A predistortion control method for an amplifier device, the amplifier device comprising a predistortion unit, a predistortion control unit and an amplifier unit, the predistortion control unit controls the predistortion unit in accordance with a signal fed back from the amplifier unit, and the predistortion control method comprises: determining power of a left side lobe of two side lobes of a frequency spectrum of the signal fed back from the amplifier unit; determining power of a right side lobe of two side lobes of a frequency spectrum of the signal fed back from the amplifier unit; determining a cost function in accordance with the power of the left and right side lobes, and controlling the predistortion unit in accordance with the cost function.

Aspect 13: An amplifier device, comprising a predistorter, a predistortion controller, a digital to analog (D/A) converter and an amplifier unit, the predistorter predistorts a digital signal to be amplified, the D/A converter converts the predistorted digital signal to an analog signal, the amplifier unit amplifies the analog signal, and the predistortion controller controls the predistorter in accordance with a signal fed back from the amplifier unit, wherein, the predistortion controller determines power of a left side lobe and a right side lobe of two side lobes of a frequency spectrum of the signal fed back from the amplifier unit, determines a cost function in accordance with the power of the two side lobes, and controls the predistorter in accordance with the cost function.

Embodiments of the present invention propose two scalar method based predistorter structures capable of counteracting memory effect, whereby nonlinearity and memory effect of the PA can be effectively removed.

Considering that the amplitude, phase and memory characteristics of the PA each has independent cost functions relevant thereto, embodiments of the present invention propose to generate a plurality of cost functions by processing digital domain feedback signals, and to optimize various sub-functional modules in the predistorter on a one-by-one basis, to thereby achieve the objective of accelerating algorithm convergence.

The amplifier device according to the embodiments of the present invention can be removed of memory effect to thereby enhance performance thereof under link structure of the scalar method.

With reference to the following explanations and the drawings, these and further aspects and features of the present invention will become more apparent. Embodiments of the present invention are disclosed in detail in the explanations and the drawings, and the modes whereby the principles of the present invention can be implemented are indicated. As should be understood, the present invention is not restricted thereby in scope. The present invention includes various modifications, variations and equivalences within the scope of the spirits and gist of the attached claims.

Features described and/or illustrated with respect to one embodiment can be used in one or more other embodiments in the same or similar manner, be combined with features in other embodiments, or replace features in other embodiments.

As should be emphasized, the term "include/comprise" and "including/comprising" as used in this paper indicates the existence of features, integral, steps or component parts, but does not exclude the existence or addition of one or more other features, integral, steps or component parts.

EXPLANATIONS OF THE ACCOMPANYING DRAWINGS

Figure 3:
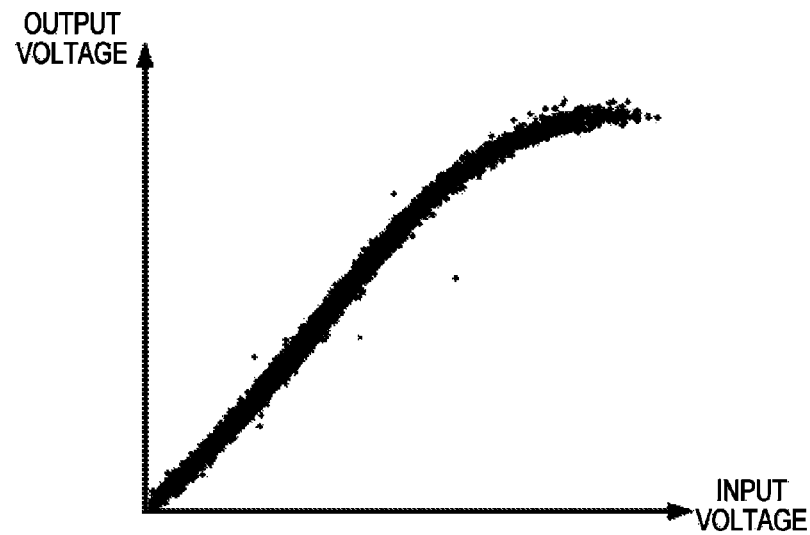

FIG. 3 schematically illustrates manifestation of memory effect in the time domain in a power amplifier.

Figure 4:
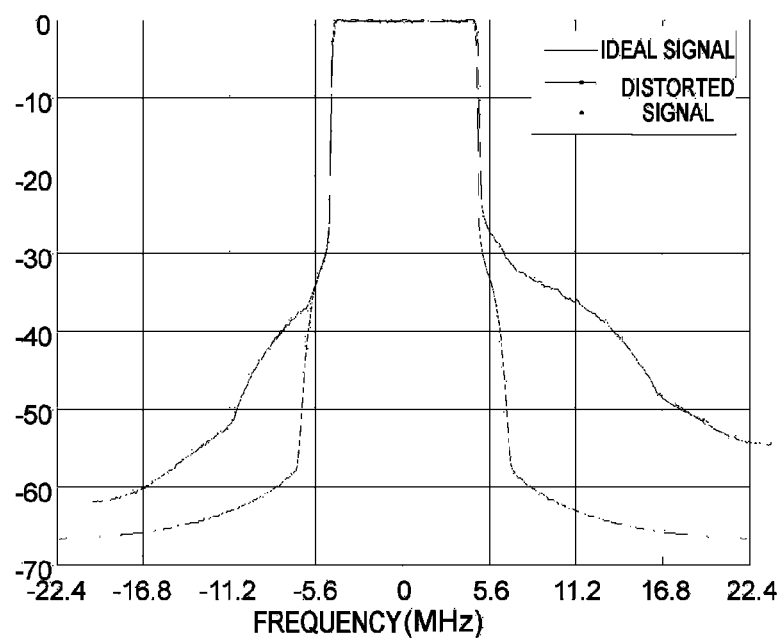

FIG. 4 schematically illustrates manifestation of memory effect in the frequency domain in a power amplifier.

Figure 5:
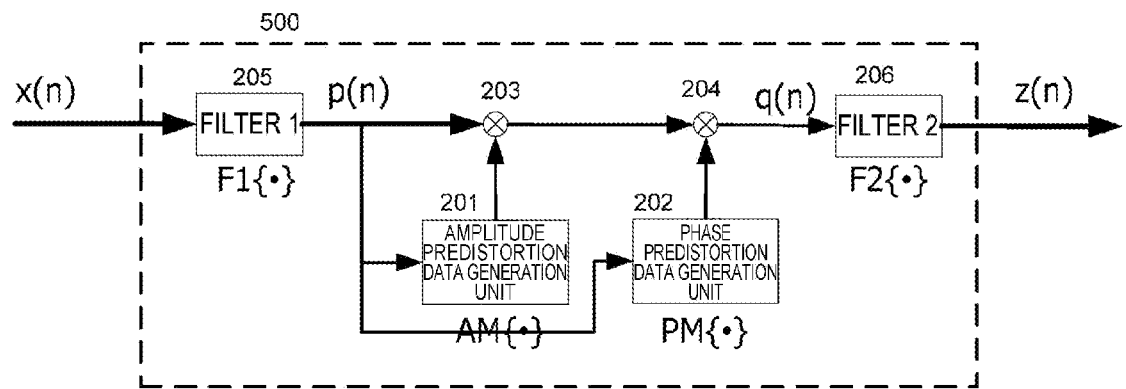

FIG. 5 schematically illustrates a predistorter according to one embodiment of the present invention.

Figure 6:
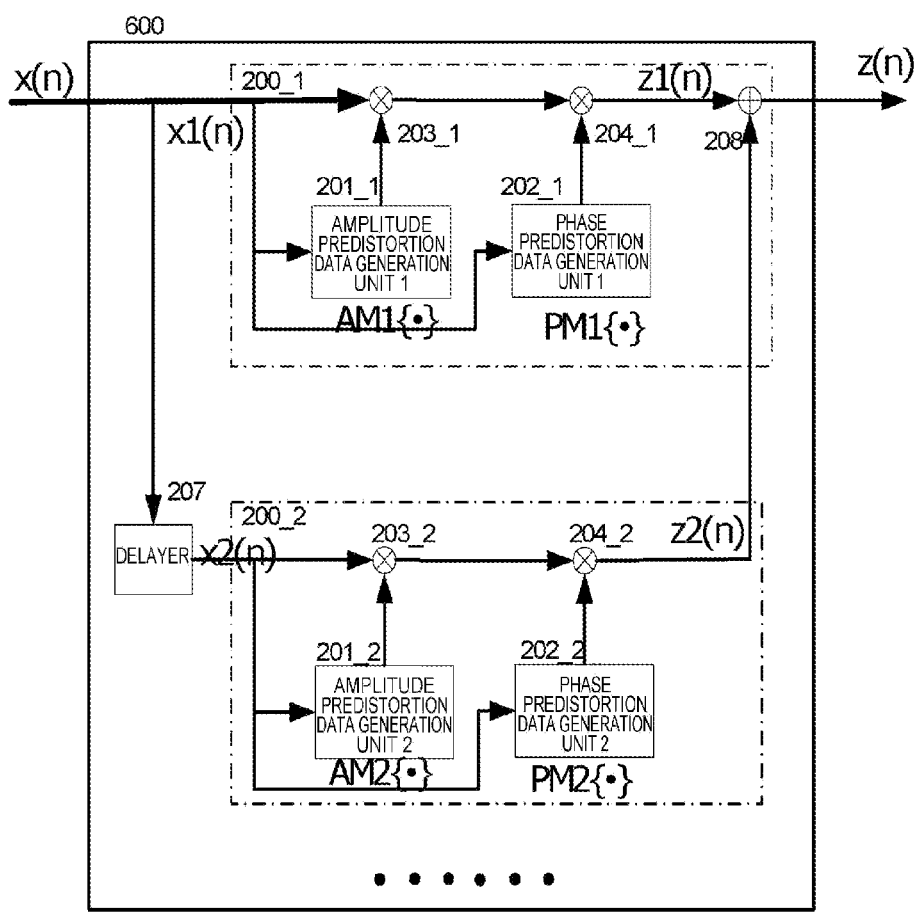

FIG. 6 schematically illustrates a predistorter according to another embodiment of the present invention.

Figure 7:
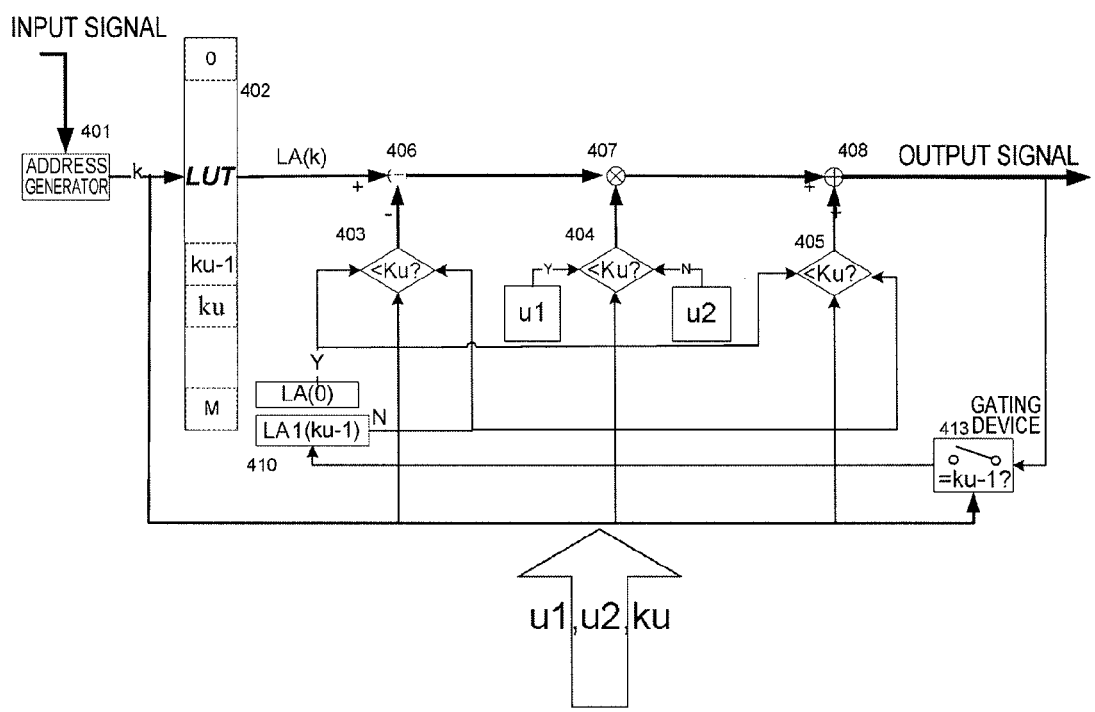

FIG. 7 schematically illustrates an amplitude predistorter according to one embodiment of the present invention.

Figure 8:
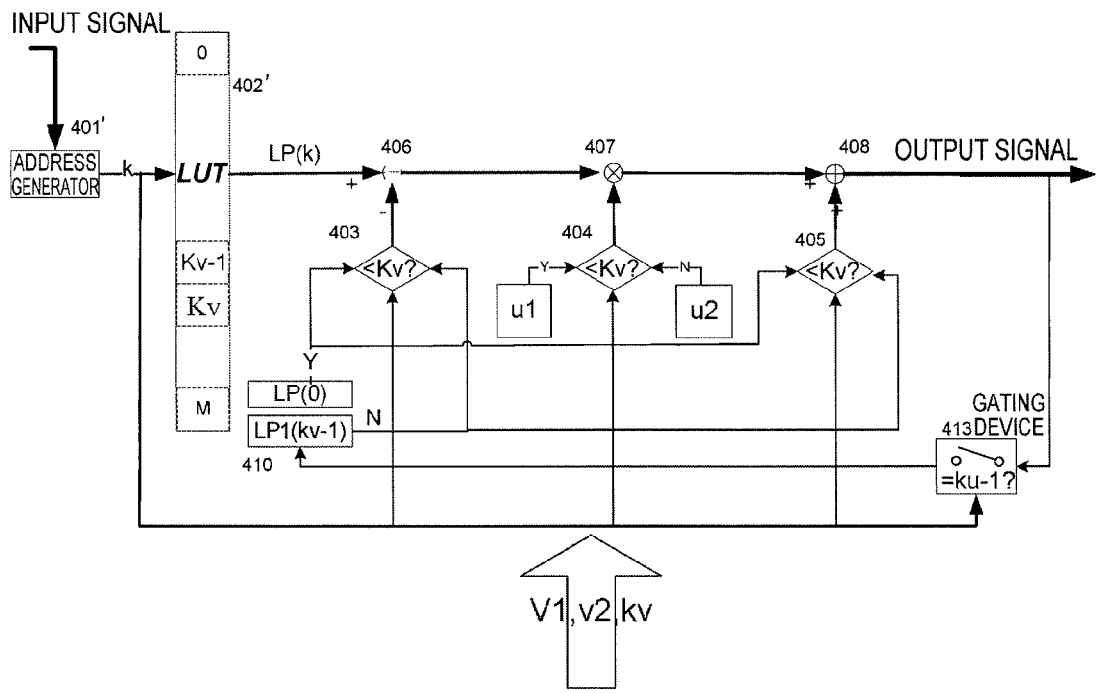

FIG. 8 schematically illustrates a phase predistorter according to one embodiment of the present invention.

Figure 9:
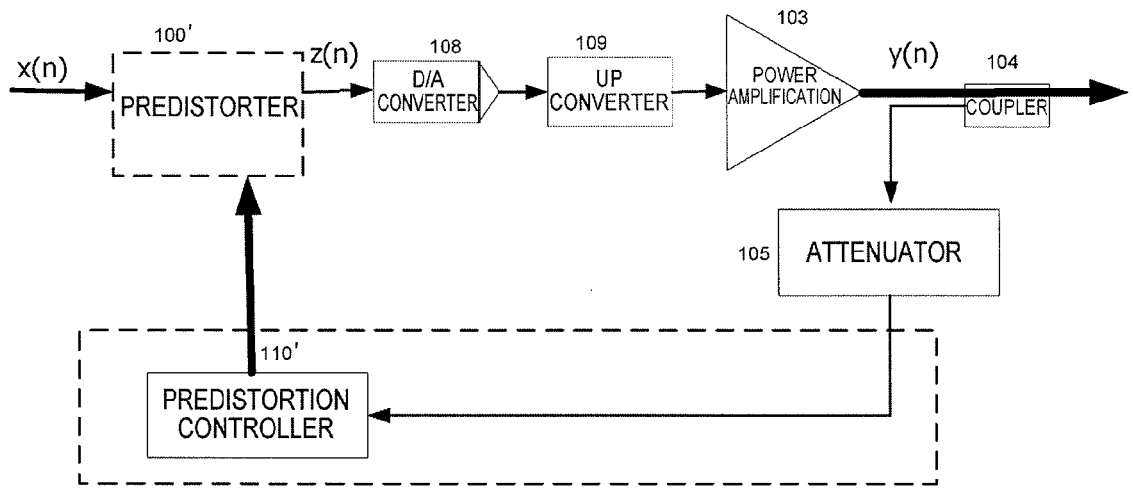

FIG. 9 schematically illustrates the structure of a scalar method based baseband digital predistortion device according to the embodiments of the present invention.

Figure 10:
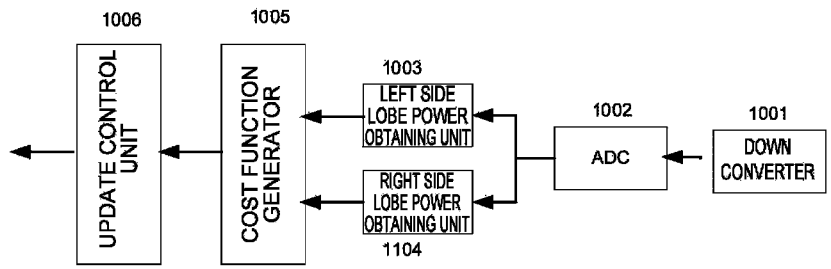

FIG. 10 schematically illustrates a predistortion controller according to one embodiment of the present invention.

Figure 11:
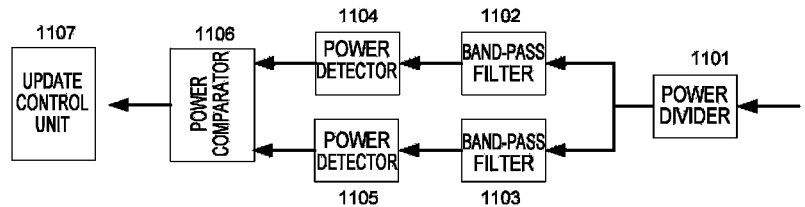

FIG. 11 schematically illustrates a predistortion controller according to another embodiment of the present invention.

Figure 12:
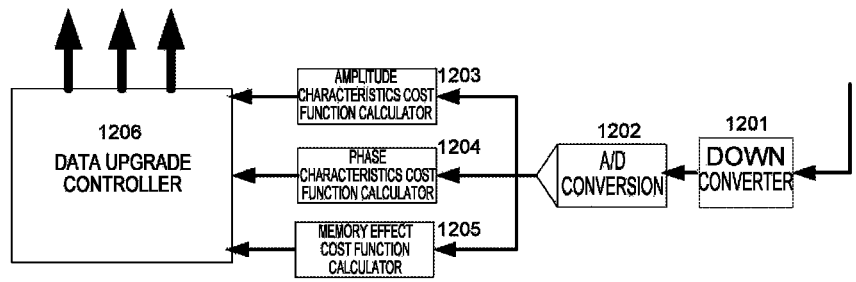

FIG. 12 schematically illustrates a predistortion controller according to yet another embodiment of the present invention.

Figure 13:
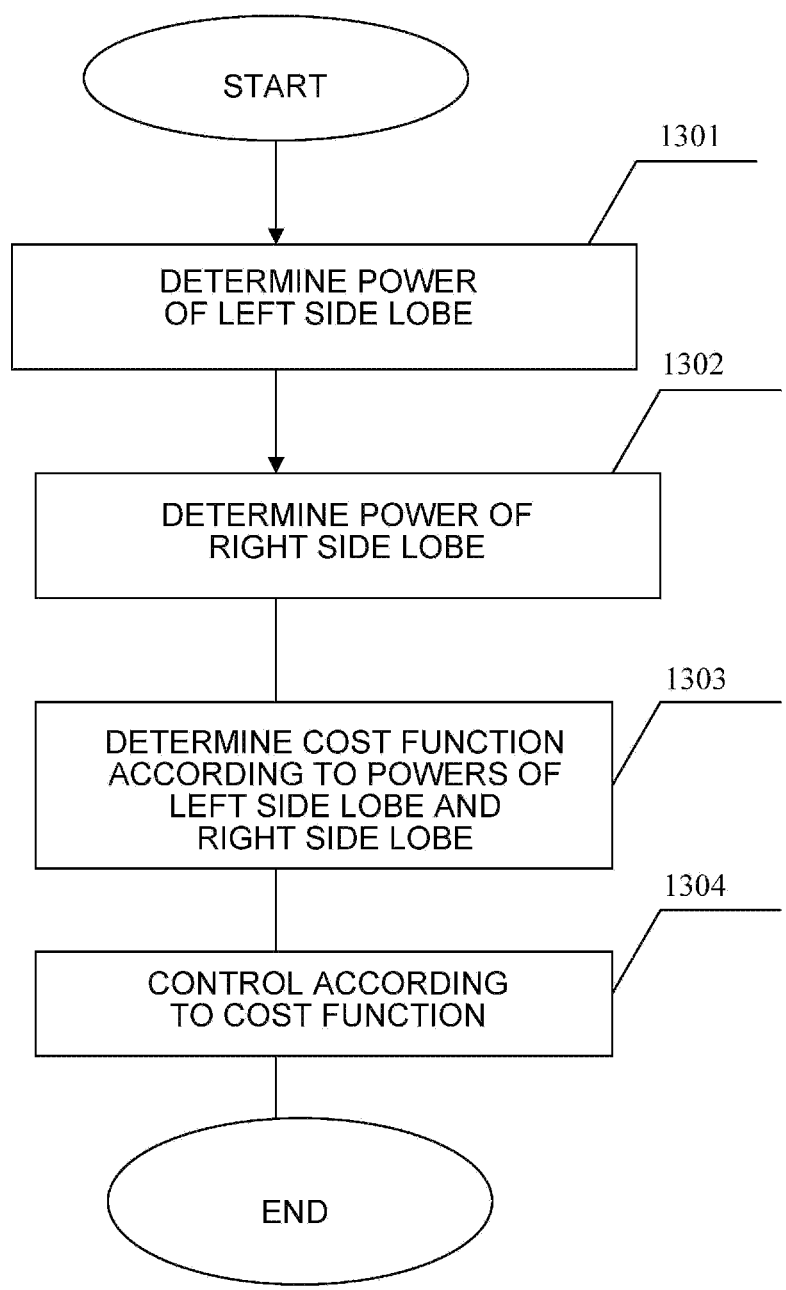

FIG. 13 is a flowchart illustrating a predistortion control method according to one embodiment of the present invention.

EMBODIMENTS OF THE INVENTION

Embodiments of the present invention are described in detailed below with reference to the drawings.

The inventors studied memory effect during the development of the present invention. FIG. 3 schematically illustrates manifestation of memory effect in the time domain in a power amplifier. In FIG. 3, the horizontal axis represents the voltage of the input signal into the PA, and the vertical axis represents the voltage of the output signal. As can be seen from FIG. 3, the curve is "very fat", that is, a plurality of input signal amplitudes (voltage) correspond to one output signal amplitude (voltage). This is so because the current output value of PA is not only related to the current input value, but also related to previous input values.

FIG. 4 schematically illustrates manifestation of memory effect in the frequency domain in a power amplifier. In FIG. 4, the vertical axis represents normalized power spectrum density, and the horizontal axis represents frequency. That is to say, memory effect manifests itself in the frequency domain as frequency selectivity, and the powers of its side lodes are different.

FIG. 5 illustrates a predistorter 500 according to one embodiment of the present invention.

As shown in FIG. 5, the original signal x(n) firstly enters a first filter 205, whose output p(n) is divided into three branches; one branch enters an amplitude predistortion data generation unit 201 to obtain amplitude predistortion data, another branch enters a phase predistortion data generation unit 202 to obtain phase predistortion data, and the remaining branch is multiplied with the amplitude predistortion data at a multiplier 203, and is then multiplied with the phase predistortion data at a multiplier 204 to obtain data q(n). Data q(n) then enters a second filter 206 to finally obtain a predistorted signal z(n). As should be noted, the first filter 205 and the second filter 206 in FIG. 5 can be used simultaneously; alternatively, only one of them can be retained.

When the above process is expressed by mathematical expressions, then $$z(n)=F2\{q(n)\} \tag{1}$$

$$q(n)=p(n)*AM\{p(n)\}*PM\{p(n)\} \tag{2}$$

$$p(n)=F1\{x(n)\} \tag{3}$$

where $F1\{\bullet\}$ and $F2\{\bullet\}$ respectively represent the functions of the two filters, and $AM\{\bullet\}$ and $PM\{\bullet\}$ respectively represent the functions of the amplitude and phase predistortion data generation units.

In practice, the first filter 205 and the second filter 206 may be digital filters such as FIR (finite impact response) filter or IIR (infinite impact response) filter. The amplitude predistortion data generation unit 201 and the phase predistortion data generation unit 202 may use modes such as polynomial, segmented line and key point interpolation etc. to perform predistortion operation. Corresponding to the modes used by the amplitude predistortion data generation unit 201 and the phase predistortion data generation unit 202, what should be controlled to be updated by the control update unit are respectively the tap coefficient of the filters, the coefficient of the polynomial, and the position of the segmented point, etc.

FIG. 6 illustrates a predistorter 600 according to another embodiment of the present invention.

As shown in FIG. 6, the original signal x(n) is divided into two branches. One branch $x1(n)$ enters a sub-predistorter 200_1, and another branch firstly enters a delayer 207. The signal $x2(n)$ coming out of the delayer 207 then enters a sub-predistorter 200_2. The first branch of signal $x1(n)$ is divided into three branches in the sub-predistorter 200_1; one branch enters an amplitude predistortion data generation unit 201_1, and another branch enters a phase predistortion data generation unit 202_1 to respectively obtain amplitude predistortion data and phase predistortion data; the remaining branch is multiplied with the amplitude predistortion data at a multiplier 203_1, and is then multiplied with the phase predistortion data at a multiplier 204_1 to obtain a predistorted signal $z1(n)$. Whereas $x2(n)$ enters the sub-predistorter 200_2, and is divided into three branches in the sub-predistorter 200_2; one branch enters an amplitude predistortion data generation unit 201_2, and another branch enters a phase predistortion data generation unit 202_2 to respectively obtain amplitude predistortion data and phase predistortion data; the remaining branch is multiplied with the amplitude predistortion data at a multiplier 203_2, and is then multiplied with the phase predistortion data at a multiplier 204_2 to obtain a predistorted signal $z2(n)$. The two predistorted sub-signals $z1(n)$ and $z2(n)$ are added at an adder 208 to obtain the predistorted signal z(n). More sub-predistorters can be added herein. The sub-predistorters are also referred to as phase amplitude predistortion data generation units. In the case there are plural sub-predistorters, delay time of delay units upstream of the sub-predistorters can either be identical or different.

When the above process is expressed by mathematical expressions, then $$z(n)=z1(n)+z2(n)+\ldots \tag{4}$$

$$z1(n)=x1(n)*AM1\{x1(n)\}*PM1\{x1(n)\} \tag{5}$$

$$z2(n)=x2(n)*AM2\{x2(n)\}*PM2\{x2(n)\} \tag{6}$$

where $AM1\{\bullet\}$, $PM1\{\bullet\}$ and $AM2\{\bullet\}$, $PM2\{\bullet\}$ respectively represent the functions of the amplitude and phase predistortion data generation units of two sub-predistorters. The amplitude predistortion data generation unit and the phase predistortion data generation unit of the sub-predistorter may use modes such as polynomial, segmentation and key point interpolation etc. to achieve their functions.

In the embodiments of the present invention, it is possible to use any amplitude predistortion data generation unit (amplitude predistorter) 201 and phase predistortion data generation unit (phase predistorter) 202 that are well known in this field of the art. In an alternative embodiment, it is possible to use the amplitude predistorter as schematically shown in FIG. 7 and the phase predistorter as schematically shown in FIG. 8.

FIG. 7 schematically illustrates an amplitude predistorter according to one embodiment of the present invention.

As shown in FIG. 7, firstly, the input signal ($x1(n)$, $x2(n)$ or P(n)) first enters an address generator 401, which obtains a lookup table address. In accordance with this lookup table address, an initial value acquisition unit 402 searches for the initial value from a lookup table. Suppose the initial value of the amplitude predistorter (amplitude predistorter initial value) can be expressed as LA=[LA(1), LA(2), ... LA(k), ..., LA(M)], where M is the length of the lookup table, and LA(k) represents the amplitude predistorter initial value to which address k corresponds. Amplitude predistorter initial values are stored in the lookup table (LUT).

A first selecting unit 403 determines the range in which k locates, and inputs the predistortion amplitude value, to which a smaller address in the range corresponds, into a subtracter 406. Specifically, in the example as shown in FIG. 7, the first selecting unit 403 compares the address k of the input signal with a key address ku from a predistortion control unit: if it is smaller than ku, value LA(0), to which the smaller address (0) of the located range ([0, ku−1]) corresponds, is input into the subtracter 406; otherwise, value LA1(ku−1), to which the smaller address (ku−1) of the located range ([ku−1, M]) corresponds, is input into the subtracter 406. The subtracter 406 subtracts the value input from the first selecting unit 403 from LA(k), and outputs the subtraction result to a multiplier 407.

A second selecting unit 404 determines the range in which k locates, and transfers coefficient u, to which the range corresponds, from the predistortion control unit to the multiplier 407. Specifically, in the example as shown in the Figure, the second selecting unit 404 compares the address k of the input signal with the key address ku from the predistortion control unit: if it is smaller than ku, a first coefficient u1, to which the range corresponds, from the predistortion control unit is transferred to the multiplier 407; if the address k is not smaller than ku, a second coefficient u2, to which the range corresponds, from the predistortion control unit is transferred to the multiplier 407. The multiplier 407 multiplies the subtraction result from the subtracter 406 with the coefficient (u1 or u2) from the second selecting unit 404, and transfers the multiplication result to the adder 408.

A third selecting unit 405 determines the range in which k locates, and inputs the predistortion amplitude value, to which a smaller address of the located range corresponds, into the adder 408. Specifically, in the example as shown in FIG. 7, the address k of the input signal is compared with the key address ku from the predistortion control unit: if it is smaller than ku, the first value LA(0) is input to the adder 408; otherwise, the second value LA1(ku−1) is input to the adder 408. The adder 408 adds the value from the third selecting unit 405 to the value from the multiplier 407, and outputs the addition result as the output LA1(k) from the amplitude predistortion data generation unit.

Part of the output signal (feedback signal) is input to a gating device 413.

In storage 410 are prestored contents identical with addresses 0 and ku−1 in the lookup table 402. The content corresponding to the address ku−1 will be updated according to the output from the gating device 413. The gating device 413 bases on the information of the address k to determine whether the address k equals to ku−1: if yes, the gating device 413 is turned on to output data p(n); if not, the gating device 413 is turned off.

Storage 410 and lookup table 402 can be stored together. Additionally, the storage 410 can be dispensed with, in which case the predistortion amplitude corresponding to the address ku−1 in the lookup table 402 is directly obtained and updated.

When the above operation is expressed by expressions, then $$LA1(k)=(LA(k)-LA(0))*u1+LA(0) \quad k<ku \quad (7)$$

$$LA1(k)=(LA(k)-LA1(ku-1))*u2+LA1(ku-1) \quad k>=ku$$
$$k=1,\ldots,M \quad (8)$$

By modifying coefficient u (u1, u2) and key address ku, the predistortion control unit can control the operation of the amplitude predistorter. The above explanation is merely exemplary in nature, as it is possible for the predistortion control unit to provide more u and more ku.

FIG. 8 exemplarily illustrates a phase predistorter according to one embodiment of the present invention.

As shown in FIG. 8, firstly, the input signal (x1(n), x2(n) or P(n)) first enters an address generator 401', which obtains a lookup table address. In accordance with this lookup table address, an initial value acquisition unit 402' searches for the initial value from a lookup table. Suppose the initial value of the phase predistortion data generation unit (phase predistorter initial value) can be expressed as LP=[LP(1), LP(2), . . . LP(k), . . . , LP(M)], where M is the length of the lookup table, and LP(k) represents the phase predistorter initial value to which address k corresponds. The initial value of the phase predistorter (phase predistorter initial value) is stored in the lookup table (LUT).

A first selecting unit 403 determines the range in which k locates, and inputs the predistortion phase value, to which a smaller address in the range corresponds, into a subtracter 406. Specifically, in the example as shown in FIG. 8, the first selecting unit 403 compares the address k of the input signal with a key address kv from a predistortion control unit: if it is smaller than kv, value LP(0), to which the smaller address (0) of the located range ([0-kv−1]) corresponds, is input into the subtracter 406; otherwise, value LP1(kv−1), to which the smaller address (kv−1) of the located range ((kv−1, M)) corresponds, is input into the subtracter 406. The subtracter 406 subtracts the value input from the first selecting unit 403 from LP(k), and outputs the subtraction result to a multiplier 407.

A second selecting unit 404 determines the range in which k locates, and transfers coefficient v, to which the range corresponds, from the predistortion control unit to the multiplier 407. Specifically, in the example as shown in the Figure, the second selecting unit 404 compares the address k of the input signal with the key address kv from the predistortion control unit: if it is smaller than kv, a first coefficient v1, to which the range corresponds, from the predistortion control unit is transferred to the multiplier 407; if the address k is not smaller than kv, a second coefficient v2, to which the range corresponds, from the predistortion control unit is transferred to the multiplier 407. The multiplier 407 multiplies the subtraction result from the subtracter 406 with v1, and transfers the multiplication result to the adder 408.

A third selecting unit 405 determines the range in which k locates, and inputs a value, to which a smaller address of the located range corresponds, into the adder 408. Specifically, in the example as shown in FIG. 8, the address k of the input signal is compared with the key address kv from the predistortion control unit: if it is smaller than kv, the first value LP(0) is input to the adder 408; otherwise, the second value LP1(kv−1) is input to the adder 408. The adder 408 adds the value from the third selecting unit 405 to the value from the multiplier 407, and outputs the addition result as the output LP1(k) from the phase predistortion data generation unit.

When the above operation is expressed by expressions, then $$LP1(k)=(LP(k)-LP(0))*v1+LP(0) \quad k<kv \quad (9)$$

$$LP1(k)=(LP(k)-LP1(kv-1))*v2+LP1(kv-1) \quad k>=kv$$
$$k=1,\ldots,M \quad (10)$$

By modifying coefficient v (v1, v2) and key address kv, the predistortion control unit can control the operation of the phase predistorter. The above explanation is merely exemplary in nature, as it is possible for the predistortion control unit to provide more v and more kv.

Although in the above explanation the initial value acquisition unit 402 and the initial value acquisition unit 402' are separately described, it is obviously possible to realize them by the same unit, in which case amplitude predistortion values and phase predistortion values are stored in the lookup table in correspondence with the addresses. The address generators 401 and 401' can likewise be realized by a single unit.

As should be noted, the circuits shown in FIGS. 7 and 8 are merely exemplary in nature, rather than restrictive to the present invention, as it is possible to conceive of other circuits according to the aforementioned expressions. For instance, the first selecting unit to the third selecting unit can be combined into one single selecting unit. Moreover, algorithms in the expressions can be realized by a logical component part having a memory, or by the logical component part employing corresponding software.

Figure 1:
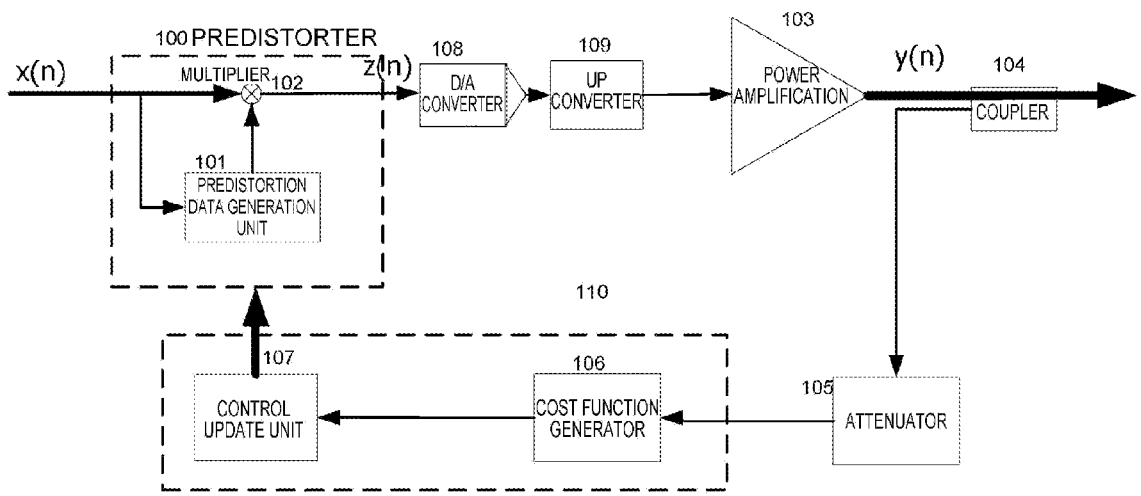
FIG. 1 illustrates the structure of a scalar method based baseband digital predistortion device.
Figure 2:
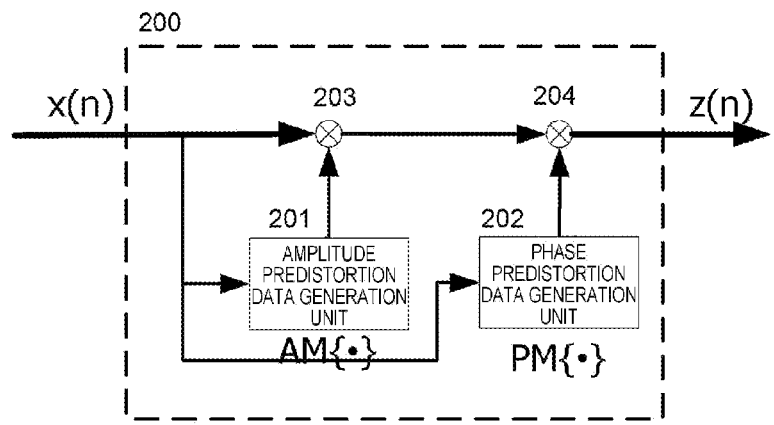
FIG. 2 is a view schematically illustrating a conventional predistorter.

FIG. 9 schematically illustrates the structure of an amplifier device according to one embodiment of the present invention. As shown in FIG. 9, the amplifier device according to this embodiment of the present invention includes a predistorter 100', a D/A converter 108, an up converter 109, an amplifier 103, a coupler 104, an attenuator 105 and a predistortion controller 110'. Of these, the predistorter 100' and the predistortion controller 110' are different from the prior-art ones as shown in FIG. 1.

The predistorter 100' can be realized by the previously introduced predistorter 500 and predistorter 600. Realization of the predistortion controller 110' is presented below.

FIG. 10 illustrates a predistortion controller according to one embodiment of the present invention. As shown in FIG. 10, the predistortion controller 110' according to this embodiment of the present invention includes a down frequency converter 1001, an analog to digital (A/D) converter 1002, a left side lobe power obtaining unit 1003, a right side lobe power obtaining unit 1004, a cost function calculation unit 1005 and a control update unit 1006.

A signal fed back from the attenuator 1005 enters the down frequency converter 1001, an analog signal with relatively low frequency as output therefrom is sent to the A/D converter (ADC) 1002, and a digital signal output therefrom is sent to the left side lobe power obtaining unit 1003 and the right side lobe power obtaining unit 1004 respectively, whereby the left side lobe power obtaining unit 1003 and the right side lobe power obtaining unit 1004 respectively obtain the power of the left side lobe and the power of the right side lobe of the frequency spectrum of the signal. Thereafter, the cost function generation unit 1005 compares the two powers, and sends the larger one of the two powers to the update control unit 1006 as a cost function. The update control unit 1006 controls the predistorter according to the cost function.

The left side lobe power obtaining unit 1003 and the right side lobe power obtaining unit 1004 can obtain the magnitudes of the powers of the two side lobes of the frequency spectrum of the feedback signal by performing digital time domain filtering or frequency domain filtering after FFT transformation on the input signal.

FIG. 11 illustrates a predistortion controller according to another embodiment of the present invention. As shown in FIG. 11, the predistortion controller according to this embodiment of the present invention includes a power divider 1101, band-pass filters 1102 and 1103, power detectors 1104 and 1105, a power comparator 1106 and a control update unit 1107.

The signal fed back from the attenuator 1105 enters the power divider 1101 to be uniformly divided into two identical parts of signals that respectively enter the band-pass filters 1102 and 1103, from which two signal components corresponding to two side lobes of the feedback signal are obtained. They are then respectively sent to the power detectors 1104 and 1105 to obtain the magnitudes of their powers. The two power values are sent to the power comparator 1106, in which the larger one of the two power values will be taken as the cost function. The cost function is thereafter sent to the control update unit 1107, which controls the predistorter according to the cost function.

In the above embodiments, the cost function is a single cost function, and the update control units 1107, 1006 adjust parameters of the aforementioned two predistorters to optimize the cost function, so as to obtain the optimized predistorter. The update processes can be formularized as:

$$\min_{AM\{\},PM\{\},F1\{\},F2\{\}} J \text{ directed to the predistorter 500}$$

$$\min_{AM1\{\},PM1\{\},AM2\{\},PM2\{\}} J \text{ directed to the predistorter 600}$$

In practice, (parameters of) each of the subunits can be optimized seriatim in the following order:

AM{•}→PM{•}→F1{•}→F2{•}→AM{•}→ . . . repeat, and

AM1{•}→PM1{•}→AM2{•}→PM2{•}→AM1{•}→ . . . repeat

At this time, the single cost function J (for instance, the larger one in power of the two side lobes) is relevant to all of AM{•}, PM{•}, F1{•} etc., so that it might be necessary to repeat the optimization for several times in order to obtain the optimized value.

FIG. 12 illustrates a predistortion controller according to yet another embodiment of the present invention. As shown in FIG. 12, the predistortion controller according to this embodiment of the present invention includes a down frequency converter 1201, an A/D converter 1202, an amplitude cost function calculation unit 1203, a phase cost function calculation unit 1204, a memory effect cost function calculation unit 1205 and a control update unit 1206.

The signal fed back from the attenuator 105 enters the down frequency converter 1201, the analog signal with relatively low frequency as output therefrom is sent to the A/D converter 1202, and the digital signal output therefrom is sent to the amplitude characteristics cost function calculation unit 1203, the phase characteristics cost function calculation unit 1204, and the memory effect cost function calculation unit 1205 respectively, whereby the amplitude characteristics cost function calculation unit 1203, the phase characteristics cost function calculation unit 1204, and the memory effect cost function calculation unit 1205 respectively obtain an amplitude cost function, a phase cost function, and a memory effect cost function.

The memory effect cost function calculation unit 1205 can calculate the differential value between the left and right side lobes of the frequency spectrum of the feedback signal as the cost function. As regards signals of such specified formats as OFDM, it is possible to compare the difference between CP and the original signal as the cost function. These are only relevant to the memory effect.

The amplitude characteristics cost function calculation unit 1203 can calculate the magnitude of the difference between amplitude distribution function (CDF or PDF) of the feedback signal and amplitude distribution function of the signal source, or the magnitude of the difference between peak-to-average power ratio of the feedback signal and peak-to-average power ratio of the signal source. These are only relevant to amplitude characteristics of power amplification. These magnitudes of differences are taken as the cost function.

The phase characteristics cost function calculation unit 1204 can calculate the amount that reflects the phase characteristics (for instance, the magnitude of the difference between phase distribution function of the feedback signal and phase distribution function of the signal source) as the cost function. Moreover, $J_{AM}$, $J_{PM}$, $J_{ME}$ are cost functions, which are related in principle only to the three characteristics of the power amplification amplitude characteristics, the phase characteristics and the memory effect, to respectively optimize AM{•}, PM{•}, F{•}. However, if any random two of the three functions have already been completely optimized, it will not be necessary for the third cost function to be related only to the characteristics corresponding thereto, whereas it is possible to make use of the power of one of the two side lobes having larger power as the cost function.

The predistortion controller discussed above can be used in cooperation with the predistorter 500 as shown in FIG. 5.

FIG. 13 is a flowchart illustrating a predistortion control method according to one embodiment of the present invention. As shown in FIG. 13, firstly the power of the left side lobe of the two side lobes of the signal fed back from the amplifier is determined in Step 1301. Subsequently in Step 1302, the power of the right side lobe of the two side lobes of the signal fed back from the amplifier is determined. For example, the device and method described with reference to FIGS. 10 and 11 can be used to determine the powers of the left and right side lobes. Thereafter in Step 1303, the cost function is determined according to the power of the left side lobe and the power of the right side lobe. Like the method employed by the devices illustrated in FIGS. 10 and 11, the larger power of the powers of the left and right side lobes can be taken as the cost function; alternatively, like the method employed by the device illustrated in FIG. 12, the power difference between the power of the left side lobe and the power of the right side lobe can be taken as the cost function for the memory effect, while at the same time other methods (as known to persons skilled in the art) are used to determine the amplitude characteristics cost function and the phase characteristics cost function. Finally in Step 1304, the predistortion unit is controlled according to the cost function.

The above explanations to the embodiments of the present invention are merely exemplary in nature, and aim to enable persons skilled in the art to clearly learn of the realization of the embodiments of the present invention. Other component parts, which are indispensable to the realization of the devices (such as the amplifier) involved in the embodiments of the present invention but have been clearly known to persons skilled in the art, are not described in this paper.

The aforementioned devices and method of the present invention can be implemented via hardware, and can also be implemented via hardware combined with software. The present invention involves such a computer-readable program that, when being executed by a logical component part, enables the logical component part to implement the devices or constituent parts thereof as described above, or enables the logical component part to implement the various methods or steps thereof as described above. The present invention also involves a storage medium, such as a hard disk, a magnetic disk, an optical disk, a DVD, or a flash memory, for storing the program.

The present invention is described with reference to embodiments above, but it should be clear to persons skilled in the art that these descriptions are merely exemplary in nature, rather than restrictive to the protection scope of the present invention. Persons skilled in the art may make various variations and modifications within the spirit and principle of the present invention, and these variations and modifications shall all be covered within the scope of the present invention.

The invention claimed is:

1. An amplifier device, comprising a predistorter, a predistortion controller, a digital to analog (D/A) converter and an amplifier unit, the predistorter predistorts a digital signal to be amplified, the D/A converter converts the predistorted digital signal to an analog signal, the amplifier unit amplifies the analog signal, and the predistortion controller controls the predistorter in accordance with a signal fed back from the amplifier unit, wherein,
the predistortion controller determines, respectively, power of a left side lobe and power of a right side lobe of two side lobes of a frequency spectrum of the signal fed back from the amplifier unit, determines a cost function in accordance with the power of the two side lobes, and controls the predistorter in accordance with the cost function,
the predistorter is one of the following two types of structures:
structure 1: the predistorter comprises a filter unit and a phase amplitude predistortion data generation unit, the phase amplitude predistortion data generation unit generates data after an amplitude predistortion and a phase predistortion, the filter unit filters at least one of data inputted to and outputted from the phase amplitude predistortion data generation unit;
structure 2: the predistorter comprises n phase amplitude predistortion data generation units, (n−1) delay units and an adder, the (n−1) delay units delay input data, respectively, to generate (n−1) delayed input data, the n phase amplitude predistortion data generation units predistort undelayed input data and the (n−1) delayed input data, respectively, to generate n data after an amplitude predistortion and a phase predistortion, the adder adds the data after the amplitude predistortion and the phase predistortion from the n phase amplitude predistortion data generation units, wherein n is an integer greater than or equal to 2.

2. The amplifier device according to claim 1, wherein the predistortion controller comprises:
a down frequency conversion unit for performing a down frequency conversion of the signal fed back from the amplifier unit;
an analog to digital (A/D) converter for performing an A/D conversion of the data after the down frequency conversion;
a left side lobe power determination unit for determining the power of the left side lobe of the two side lobes;
a right side lobe power determination unit for determining the power of the right side lobe of the two side lobes;
a cost function determination unit for taking the larger one of the power of the first and right side lobes as the cost function; and
an update control unit for controlling the predistorter in accordance with the cost function.

3. The amplifier device according to claim 2, wherein the left side lobe power determination unit or the right side lobe power determination unit performs a digital time domain filtering on the data after the AD conversion, or performs a FFT on the data after the AD conversion and then performs a frequency domain filtering, so as to obtain the power of the left side lobe or the right side lobe.

4. The amplifier device according to claim 1, wherein the predistorter comprises:
a power divider for equally dividing the signal fed back from the amplifier unit into a first portion of signal and a second portion of signal having the equal power;
a first band-pass filter for filtering the first signal portion, so as to filter and obtain composition corresponding to the left side lobe;
a second band-pass filter for filtering the second portion of signal, so as to filter and obtain composition corresponding to the right side lobe;
a first power detector for detecting power of the composition of the left side lobe;
a second power detector for detecting power of the composition of the right side lobe;
a power comparator for comparing the power of the composition of the left side lobe with the power of the composition of the right side lobe, and taking the larger one as the cost function; and
an update control unit for controlling the predistorter in accordance with the cost function.

5. The amplifier device according to claim 1, wherein the predistorter comprises:
a down frequency conversion unit for performing a down frequency conversion of the signal fed back from the amplifier unit;
an analog to digital (A/D) converter for performing an A/D conversion on the data after the down frequency conversion;
an amplitude characteristics cost function calculation unit for determining a cost function related to amplitude characteristics, in accordance with the data after the AD conversion;
a phase characteristics cost function calculation unit for determining a cost function related to phase characteristics, in accordance with the data after the AD conversion;
a memory effect cost function calculation unit for determining a cost function related to memory effect, in accordance with the data after the AD conversion; and
an update control unit for controlling the predistorter in accordance with the cost function related to amplitude characteristics, the cost function related to phase characteristics, and the cost function related to memory effect, respectively.

6. The amplifier device according to claim 5, wherein the amplitude characteristics cost function calculation unit calculates a difference between amplitude distribution functions of the fed back signal and a signal source, or a difference between peak-to-average power ratios of the fed back signal and the signal source, as the cost function related to amplitude characteristics.

7. The amplifier device according to claim 5, wherein the memory effect cost function calculation unit calculates the power of the left side lobe and the power of the right side lobes, and takes a difference between the power of the left side lobe and the power of the right side lobes as the cost function related to memory effect.

8. The amplifier device according to claim 5, wherein the cost function related to amplitude characteristics is a cost function only related to amplitude characteristics, the cost function related to memory effect is a cost function only related to memory effect, while the cost function related to phase characteristics is a cost function related to all of the phase characteristics, memory effect and amplitude characteristics, the update control unit firstly controls the predistorter in accordance with the cost function related to amplitude characteristics and the cost function related to memory effect, respectively, and then controls the predistorter in accordance with the cost function related to phase characteristics.

9. The amplifier device according to claim 1, wherein the phase amplitude predistortion data generation unit comprises:
an address generator for acquiring an amplitude address and a phase address in accordance with amplitude or phase of signal inputted to the phase amplitude predistortion data generation unit;
an initial value acquisition unit for determining an initial predistortion amplitude in accordance with the amplitude address, and acquiring an initial predistortion phase in accordance with the phase address;
an amplitude predistortion unit for determining data after the amplitude predistortion in accordance with the amplitude address and an amplitude address period determined based on a key amplitude address;
a phase predistortion unit for determining data after the phase predistortion in accordance with the phase address and a phase address period determined based on a key phase address; and
an multiplication unit for multiplying the data after the amplitude predistortion with the data after the phase predistortion.

10. A predistortion control method for an amplifier device, the amplifier device comprises a predistortion unit, a predistortion control unit and an amplifier unit, the predistortion control unit controls the predistortion unit in accordance with a signal fed back from the amplifier unit, and the predistortion control method comprises:
determining power of a left side lobe of two side lobes of a frequency spectrum of the signal fed back from the amplifier unit;
determining power of a right side lobe of two side lobes of a frequency spectrum of the signal fed back from the amplifier unit;
determining a cost function in accordance with the power of the left side lobe and the power of right side lobe, and
controlling the predistortion unit in accordance with the cost function.

* * * * *